(12) United States Patent
Lee et al.

(10) Patent No.: US 7,083,737 B2
(45) Date of Patent: Aug. 1, 2006

(54) METHOD FOR MANUFACTURING A MICRO-ACTUATOR

(75) Inventors: Jin-ho Lee, Suwon (KR); Young-chul Ko, Seoul (KR); Do-hyun Kong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 103 days.

(21) Appl. No.: 10/791,756

(22) Filed: Mar. 4, 2004

(65) Prior Publication Data

US 2004/0163226 A1    Aug. 26, 2004

Related U.S. Application Data

(62) Division of application No. 09/873,382, filed on Jun. 5, 2001, now Pat. No. 6,781,279.

(30) Foreign Application Priority Data

Aug. 18, 2000  (KR) ................................ 00-47609

(51) Int. Cl.
*H01L 21/302* (2006.01)
(52) U.S. Cl. .............................. 216/2; 438/50; 438/52; 438/53; 359/201; 359/202; 359/223; 359/224; 361/283.1
(58) Field of Classification Search ..................... 216/2
See application file for complete search history.

(56) References Cited

U.S. PATENT DOCUMENTS

| | | | |
|---|---|---|---|
| 5,025,346 A | 6/1991 | Tang et al. | |
| 5,064,782 A | 11/1991 | Nishiguchi | |
| 5,097,480 A | 3/1992 | Pease | |
| 5,536,988 A | 7/1996 | Zhang et al. | |
| 5,629,790 A | 5/1997 | Neukermans et al. | |
| 5,668,033 A | 9/1997 | Ohara et al. | |
| 5,999,306 A | 12/1999 | Atobe et al. | |
| 6,062,461 A * | 5/2000 | Sparks et al. | 228/123.1 |
| 6,116,863 A | 9/2000 | Ahn et al. | |
| 6,262,463 B1 * | 7/2001 | Miu et al. | 257/414 |
| 6,262,827 B1 | 7/2001 | Ueda et al. | |
| 6,424,504 B1 | 7/2002 | Abe et al. | |

(Continued)

FOREIGN PATENT DOCUMENTS

DE        197 44 292        4/1998

(Continued)

OTHER PUBLICATIONS

Examination Report issued by the European Patent Office on Jun. 15, 2004 in corresponding application.

(Continued)

*Primary Examiner*—Nadine G. Norton
*Assistant Examiner*—Patricia George
(74) *Attorney, Agent, or Firm*—Buchanan Ingersoll PC

(57) ABSTRACT

A micro-actuator having a stage capable of a see-saw motion and a method for its manufacture are disclosed. In the micro-actuator according to the present invention, a plurality of parallel driving comb-type electrodes are formed on the bottom of the stage, and a plurality of parallel fixed comb-type electrodes are formed on a base plate. At both sides of the stage is a torsion bar that enables the see-saw motion. The torsion bar is supported by a frame comprised of a first frame layer and a second frame layer. The torsion bar and the first frame layer form one body. The first and second frame layers are bonded by a metal eutectic bonding layer between metal layers.

11 Claims, 16 Drawing Sheets

U.S. PATENT DOCUMENTS

| | | | |
|---|---|---|---|
| 6,469,415 B1 * | 10/2002 | Jerman et al. | 310/309 |
| 2002/0021055 A1 | 2/2002 | Lee et al. | |
| 2002/0054415 A1 | 5/2002 | Lee | |
| 2002/0113296 A1 * | 8/2002 | Cho et al. | 257/659 |

FOREIGN PATENT DOCUMENTS

| | | |
|---|---|---|
| EP | 1 020 984 | 7/2000 |
| JP | 5-76186 | 3/1993 |
| JP | 5-302182 | 11/1993 |
| JP | 2000-11556 | 1/2000 |
| JP | 2000-147419 | 5/2000 |
| JP | 2000147419 | 5/2000 |
| JP | 2002-137200 | 5/2002 |
| KR | 99-20488 | 6/1999 |

OTHER PUBLICATIONS

P.F. Indermuehle et al.; Design and Fabrication of an Overhanging xy-microactuator with integrated Tip for Scanning Surface Profiling; May 1, 1994; pp. 346-350; vol. A43, No. 1/3; Sensors and Actuators A, Elsevier Sequoia S.A., Lausanne, Switzerland.

* cited by examiner

METHOD FOR MANUFACTURING A MICRO-ACTUATOR

This application is a divisional application of U.S. patent application Ser. No. 09/873,382, filed Jun. 5, 2001 now U.S. Pat. No. 6,781,279, which claims priority to Korean Patent Application No. 00-47809, filed Aug. 18, 2000, the entire contents of which are hereby incorporated by reference.

BACKGROUND OF THE INVENTION

1. Field of the Invention

The present invention relates to a micro-actuator operated by electrostatic force and a manufacturing method thereof, and more particularly, to a micro-actuator driven in a see-saw motion in an axial direction and a manufacturing method thereof.

2. Description of the Related Art

U.S. Pat. No. 5,025,346 discloses a micro-actuator operated by the electrostatic force induced by the structure of a comb-type electrode. The micro-actuator disclosed in U.S. Pat. No. 5,025,346 has a structure with a plurality of moving comb-type electrodes and a plurality of fixed comb-type electrodes arranged alternately on a moving structure and a fixed structure, respectively. The moving structure is suspended by a surrounding supporting structure and the suspended structure is driven at a resonant frequency in the horizontal direction.

To drive in the direction of more than 1 axis such as the x-axis and the y-axis, if driving is in one direction along one axis, more than 3 electrodes are needed in the driving part, and if driving is in both directions along one axis, at least 5 electrodes are needed. U.S. Pat. No. 5,536,988 discloses an actuator that is fabricated using a modified single crystal reactive etching and metalization process which incorporates an isolation process utilizing thermal oxidation of the device.

In the prior micro-actuator, the driving comb-type electrodes are arranged in a direction parallel to the plane of the stage of a moving body or a moving structure, and the fixed comb-type electrodes are arranged on a fixed structure, alternating with the driving comb-type electrodes and parallel to the plane of the stage in the same way as the driving comb-type electrodes.

Since the comb-type electrodes are arranged in the neighborhood of the stage in the prior micro-actuator as described above, the total size is expansive compared to the stage or the moving structure. The prior micro-actuator has a structure driven in the direction of an axis or two axes (x, y-axis) parallel to the plane of the stage or the moving structure, and the application is thus limited.

Korean patent application no. 98-37315 and Korean patent application no. 99-20488 that claims the priority based on the latter application disclose a micro-actuator with a see-saw driving method in one axial direction. The applications disclose a micro-actuator applicable to an optical disk drive. This micro-actuator may be applied to various fields as an optical scanner as well. However, this see-saw driving micro-actuator has a stage back driving structure where the driving comb-type electrodes and the fixed driving comb-type electrodes are arranged at the back of the stage and on the top of the plate corresponding to the back, and since the top and bottom structures are manufactured using two substrates and these are joined together afterward, the manufacture is not easy. Particularly, it is difficult to join the top and bottom structures if foreign materials exist on at least one of the driving comb-type electrodes and the fixed comb-type electrodes arranged in each structure. Therefore, there is a need to provide a structure where the top and bottom structures can be processed separately and joined successfully, and a method for its manufacture.

SUMMARY OF THE INVENTION

It is therefore an object of the present invention to provide a micro-actuator which is easy to manufacture and has a high yield, and it is a second object of the present invention to provide a method of manufacturing the same.

To achieve the first object, the micro-actuator of the present invention comprises a base plate on which a predetermined pattern of signal lines is formed, a plurality of fixed comb-type electrodes that are arranged on the base plate and extend in a direction perpendicular to the base plate, a stage capable of a see-saw motion that is arranged at a predetermined height from the top of the base plate, a plurality of driving comb-type electrodes which are formed parallel to each other on the bottom of the stage and have ends that extend between the fixed comb-type electrodes, a torsion bar with a predetermined length that is arranged at both ends of the stage forming one body with the stage in order to enable the see-saw motion of the stage, a first frame layer connected to both ends of the torsion bar, a second frame layer that is positioned below the first frame layer, thus forming a layered structure with the first frame layer, and a metal eutectic bonding layer formed between the first and second frame layers to bond them together.

In the micro-actuator of the present invention, the first frame layer, the torsion bar, the stage, and the driving comb-type electrode are preferably formed integrally.

The first frame layer has the shape of a rectangular border that surrounds the stage. Between the first frame layer and the stage, a separate region of a predetermined width exists, which the torsion bar preferably crosses.

The fixed comb-type electrodes are formed on an electrode base that is arranged on the base plate. The electrode base, the fixed comb-type electrodes, and the second frame layer are made preferably from the same material plate.

The fixed comb-type electrodes are higher than the second frame layer, and thus the front ends of the fixed comb-type electrodes are positioned higher than the top of the second frame layer. Also the front ends of the driving comb-type electrodes and the first frame layer are preferably on a common plane.

The metal eutectic bonding layer of the present invention is composed of a plurality of metal layers, among which the middle metal layer is preferably a layer plated with Au/Sn alloy.

To achieve the second object, a method for manufacturing the micro-actuator of the present invention comprises the steps of forming a top structure by etching both sides of a first plate, the top structure comprising a stage, a plurality of comb-type electrodes formed on the bottom of the stage, a torsion bar positioned in the middle of both edges facing the stage, and a first frame layer of a predetermined height supporting the torsion bar, forming a bottom structure by etching both sides of a second plate, the bottom structure comprising a base plate, a second frame layer formed on the base plate and having a predetermined height corresponding to the first frame layer height, and a plurality of fixed comb-type electrodes formed on the base plate, and joining the top and bottom structure to form one body by forming a eutectic bonding layer between the first frame layer and the second frame layer, and superimposing the driving and fixed comb-type electrodes such that the extensions of the driving comb-type electrodes alternate with the extensions of the fixed comb-type electrodes.

In the method for manufacturing a micro-actuator of the present invention, preferably, the step of forming the top structure further comprises the steps of forming a top separate region with a predetermined width and depth corresponding to the space between the stage and the first frame layer, forming a top metal layer on the region corresponding to the first frame layer, and forming the driving comb-type electrodes with a predetermined height on the bottom of the stage, while the separate region is penetrated by etching the bottom of the first plate with a predetermined pattern.

It is also preferable that the step of forming the bottom structure further comprises the steps of forming signal lines with a predetermined pattern corresponding to the constituent elements, forming a bottom separate region with a predetermined width and depth corresponding to the space between the second frame layer and the fixed comb-type electrodes, joining the bottom of the second plate to the top of the base plate, etching the region corresponding to the second frame layer on top of the second plate to a predetermined depth, forming a bottom metal layer at the etched part of the second plate, forming a mask layer on the region corresponding to the second frame layer and the fixed comb-type electrodes on top of the second plate, and forming the fixed comb-type electrode with a predetermined height inside of the bottom separate region, while the bottom separate region is penetrated by etching the region that is not covered by the mask layer to a predetermined depth.

In addition, in the method of manufacturing a micro-actuator of the present invention, it is preferable that the step of forming the top metal layer further comprises the steps of forming a metal seed layer at the first plate and forming a metal eutectic bonding layer by a plating method on the seed layer.

Also, it is preferable that the step of joining the top and bottom structures into one body is a step of performing the metal eutectic bonding at a predetermined temperature and pressure in contact in order to join the first frame layer of the top structure to the second frame layer of the bottom structure, and more specifically with the top metal layer of the first frame layer of the top structure and the bottom metal layer of the second frame layer of the bottom structure in contact.

BRIEF DESCRIPTION OF THE DRAWING(S)

The above objects of the present invention will become more apparent by describing in detail a preferred embodiment thereof with reference to the attached drawing(s) in which.

DESCRIPTION OF THE PREFERRED EMBODIMENT(S)

Hereinafter, preferred embodiments of the present invention will be described in greater detail with reference to the appended drawings.

Figure 1:
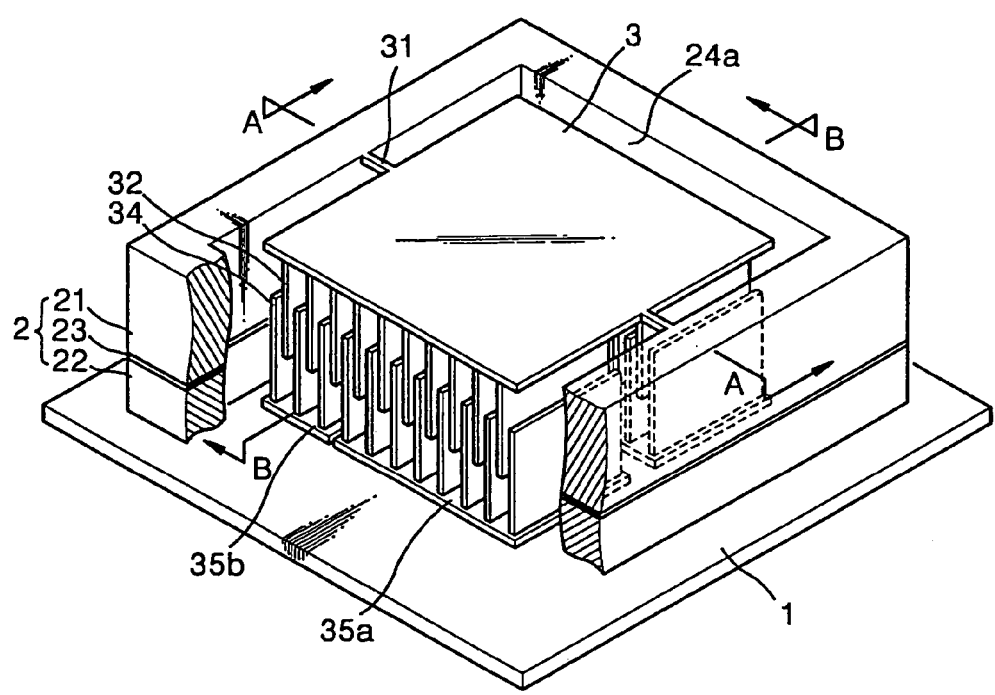
FIG. 1 is a perspective view illustrating a preferred embodiment of a micro-actuator of the present invention.

Referring to FIG. 1, a frame 2 in the shape of a rectangular border is situated on a base plate 1 that is made of PYREX® glass material, etc. and a stage 3 is positioned inside the frame 2. The stage is supported by a torsion bar 31 that is connected to the frame 2 and extends to the middle part of two ends of the frame 2 which face each other.

The frame 2, the stage 3, and the torsion bar 31 are formed integrally. The frame 2 and the torsion bar 31 provide an electrical path to the stage 3. The torsion bar 31 supports a see-saw motion of the stage 3, and provides an appropriate elastic restoring force upon movement of the stage.

The frame 2 comprises a first frame layer 21 and a second frame layer 22 with a metal eutectic bonding layer plated with Au/Sn alloy between the two frame layer. The first frame layer 21, the stage 3, and the torsion bar 31 are obtained from a material plate, for example, a silicon wafer, that is made by a number of steps which will be described later. Between the first frame layer 21 and the stage 3 is a space 24a forming a rectangular border. The torsion bar 31, which extends from both ends of the stage 3, crosses the space 24a.

Figure 2:
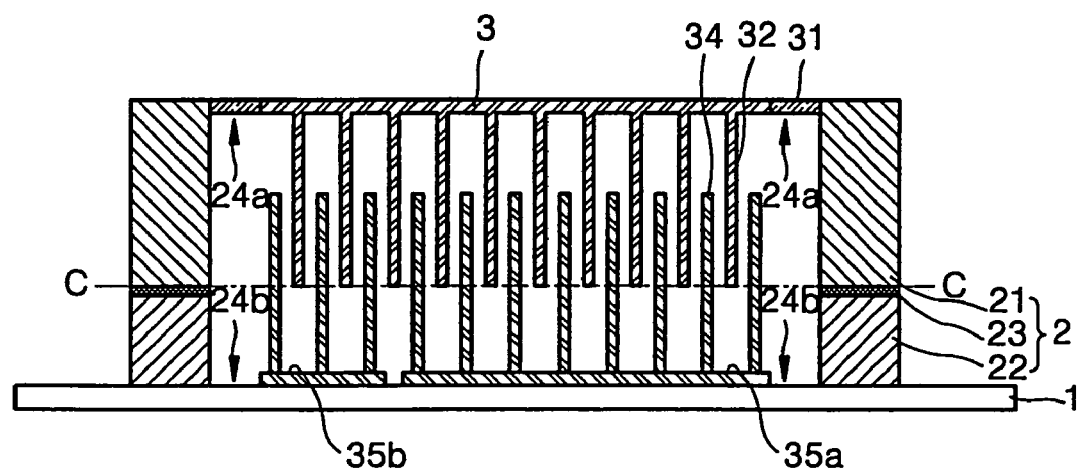
FIG. 2 is a cross-sectional view cut in the direction of the line A—A of FIG. 1.
Figure 3:
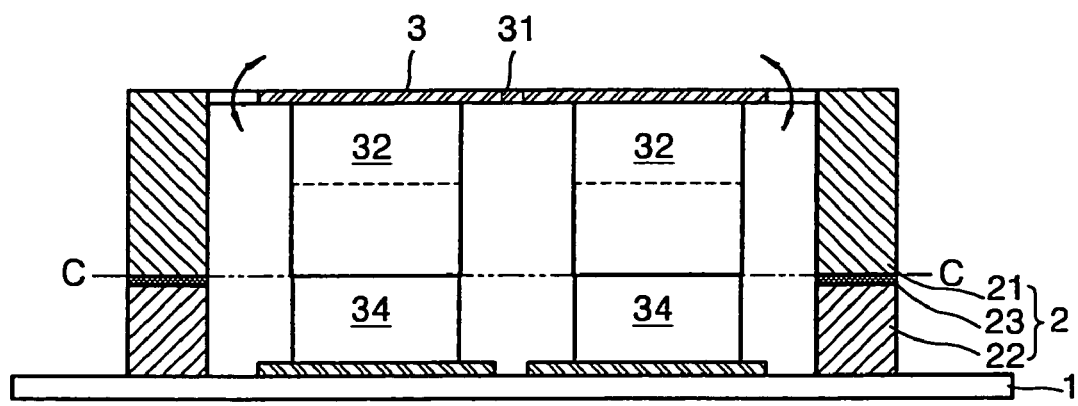
FIG. 3 is a cross-sectional view cut in the direction of the line B—B of FIG. 1.

As shown in FIGS. 2 and 3, a plurality of driving comb-type electrodes 32 extend downward in a direction perpendicular to the bottom of the stage 3 and are parallel to one another. A plurality of fixed comb-type electrodes 34 that alternate between the driving comb-type electrodes 32 extend upward from the bottom of the stage 3.

The fixed comb-type electrodes 34 are formed on first and second electrode bases 35a and 35b that are separated electrically. The fixed comb-type electrodes 34 formed on the first electrode base 35a generate a driving power for the stage 3 by the electrostatic force induced between the fixed comb-type electrodes 34 and the driving comb-type electrodes 32. The fixed comb-type electrodes 34 formed on the second electrode base 35b operate as a sensor of a variable capacitor, etc., depending on the relative position of the fixed and driving comb-type electrodes, together with the driving comb-type electrodes 32 on top corresponding to the fixed comb-type electrodes.

The second frame layer 22 of the frame 2, the first and second electrode bases 35a and 35b, and the fixed comb-type electrodes 34 are made from a material plate, for example, a silicon wafer. Between the first and second electrodes 35a and 35b and the frame 2, a separate region 24b forming a rectangular border exists.

The base plate 1 is an element that is attached as a separated piece when manufacturing the first and second electrode bases 35a and 35b and the second frame layer 22 of the frame 2. The first and second electrode bases 35a and 35b and the frame 2 and metal pads containing signal lines are formed thereon.

As shown in FIGS. 2 and 3, the height of the fixed comb-type electrode is greater than that of the second frame layer 22. Thus, the front ends of the fixed comb-type electrodes 34 are positioned higher than the top of the second frame layer 22. Also, the bottom ends (i.e., the front ends) of the driving comb-type electrodes 32 and the bottom of the first frame layer 21 are positioned on a common plane (C-C). The first and second frame layer easily bond the top and bottom structures made as separate plates. When the first and second frame layers 21 and 22 of the frame 2 are bonded to form one body, the driving comb-type electrodes 32 and the fixed comb-type electrodes 34 overlap with a certain width of space between them.

In order to manufacture the micro-actuator of the present invention having the structure described above, a preferred example of the method for manufacturing the micro-actuator of the present invention is explained below. Here in each step, the constituent elements of the micro-actuator shown in FIGS. 1 through 3 are referred to.

1. A Method of Manufacturing the Top Structure

Figure 4A:
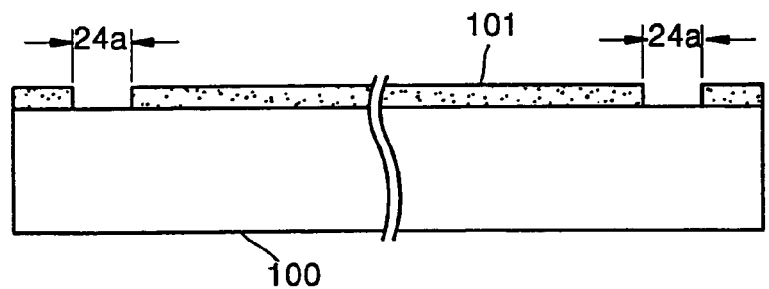
FIGS. 4a–4m are process diagrams illustrating the steps of manufacturing the top structure of a micro-actuator of the present invention.
Figure 4B:
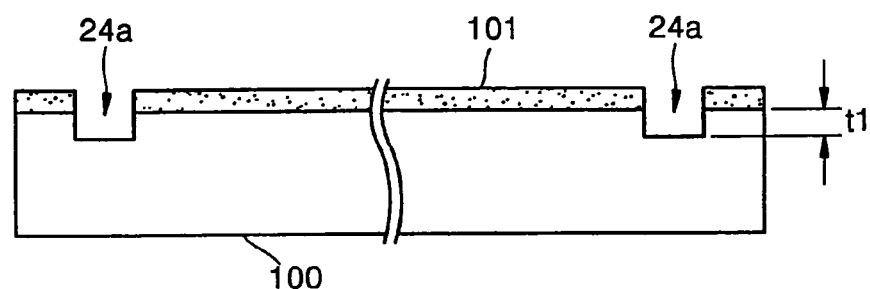
Figure 4C:
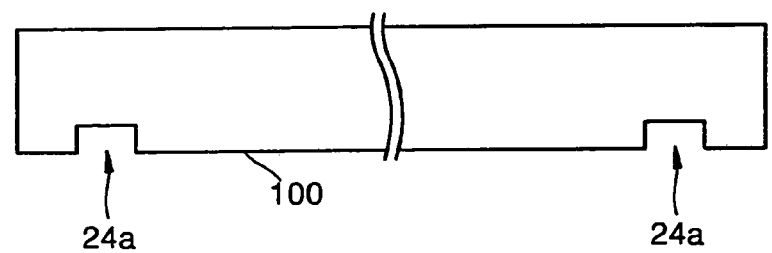
Figure 4D:
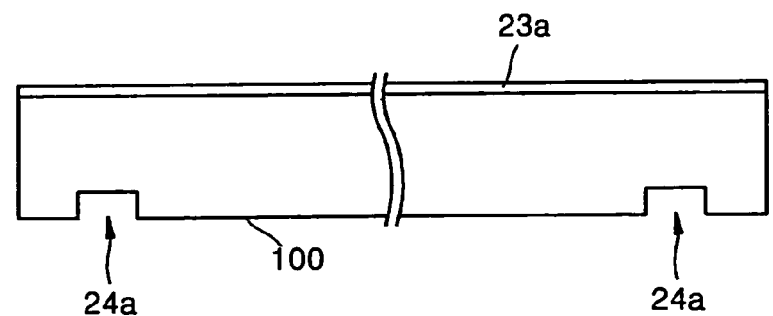
Figure 4E:
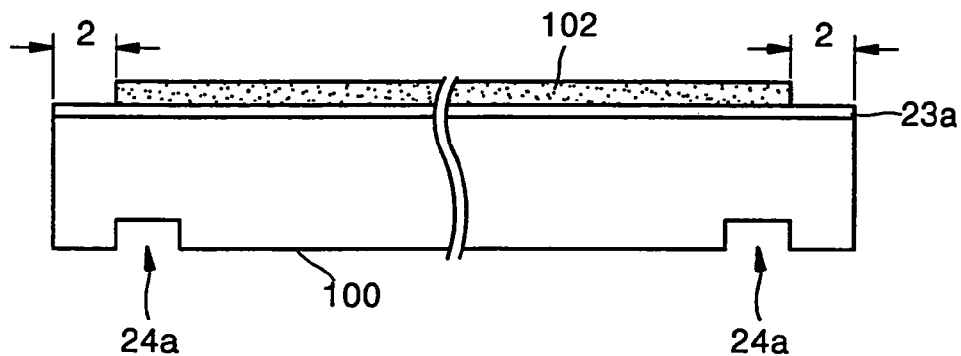
Figure 4F:
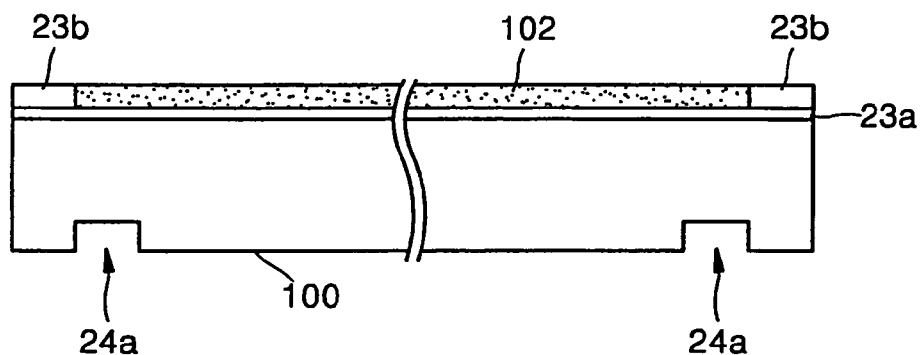
Figure 4G:
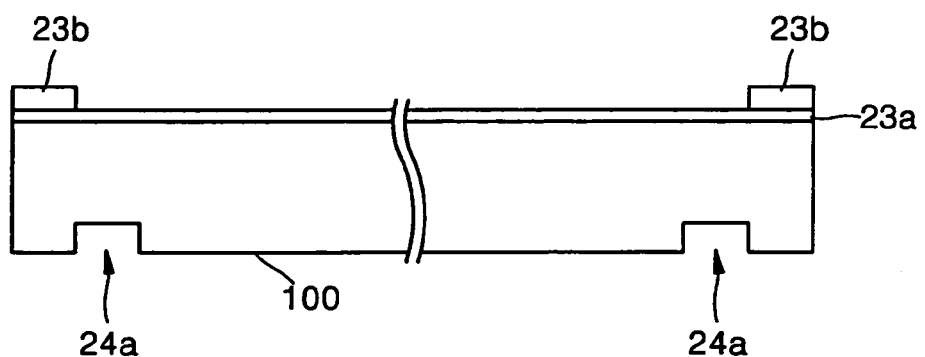
Figure 4H:
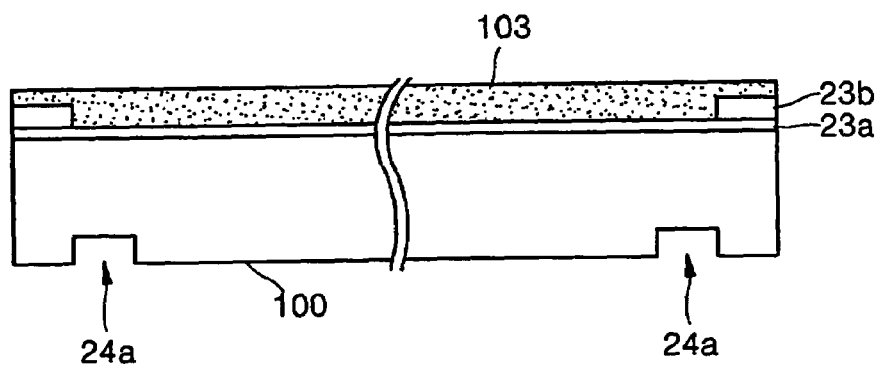
Figure 4I:
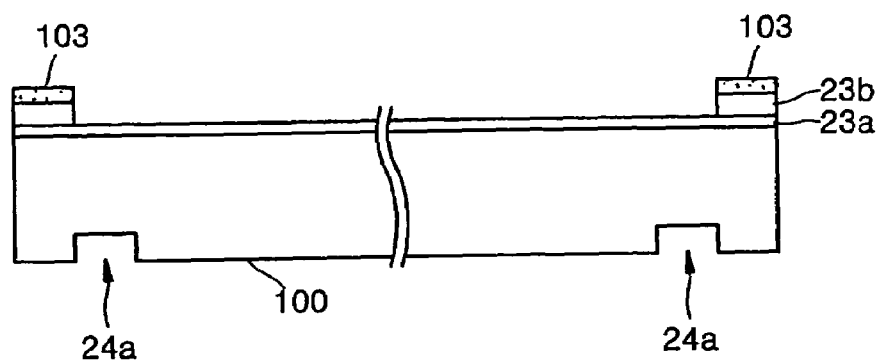
Figure 4J:
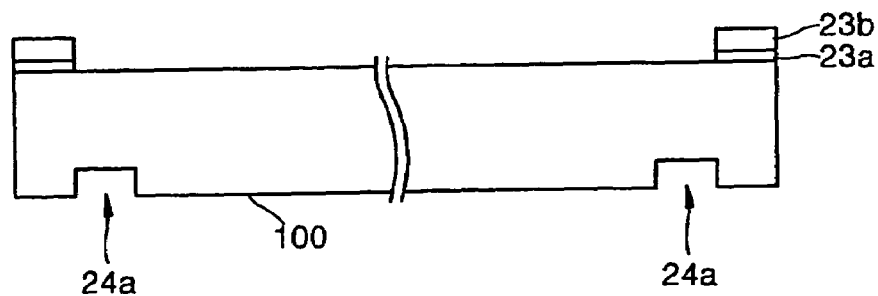
Figure 4K:
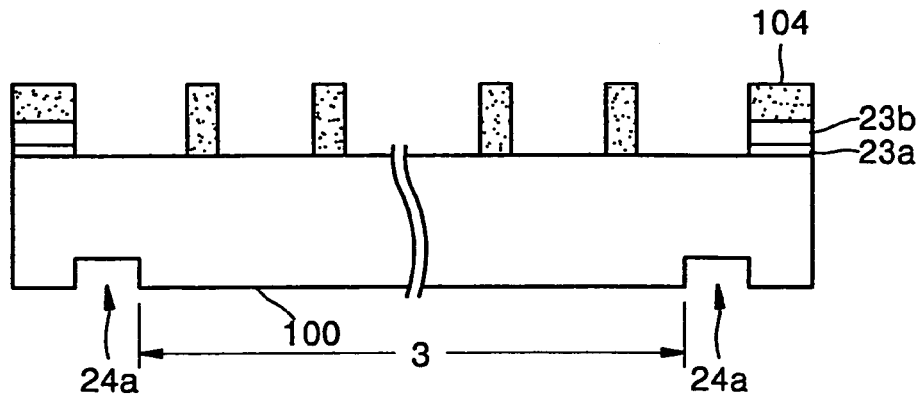
Figure 4L:
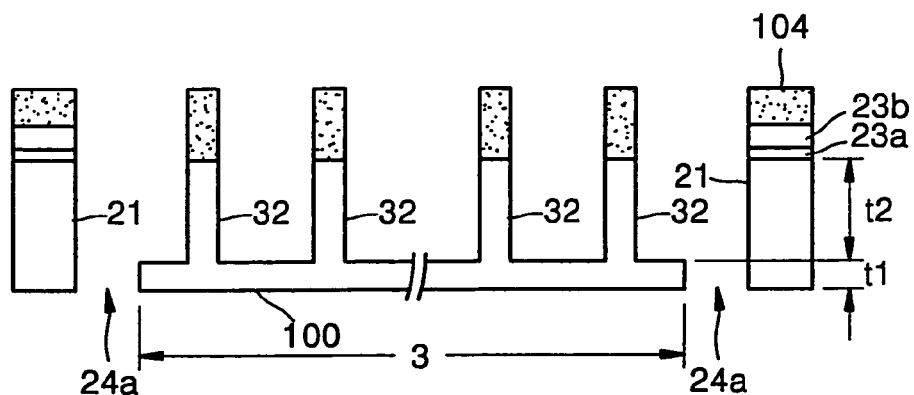
Figure 4M:
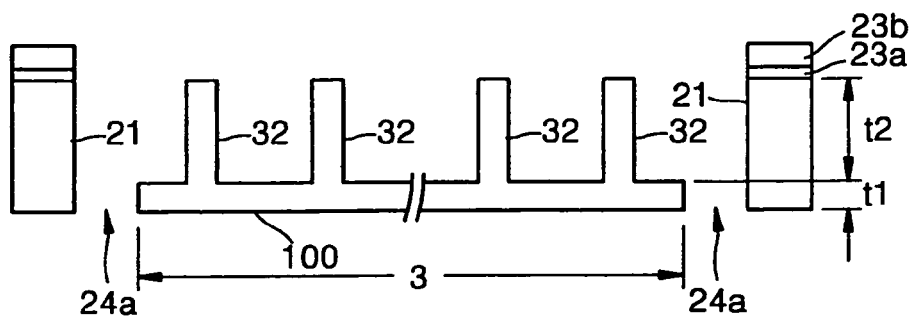
Figure 5:
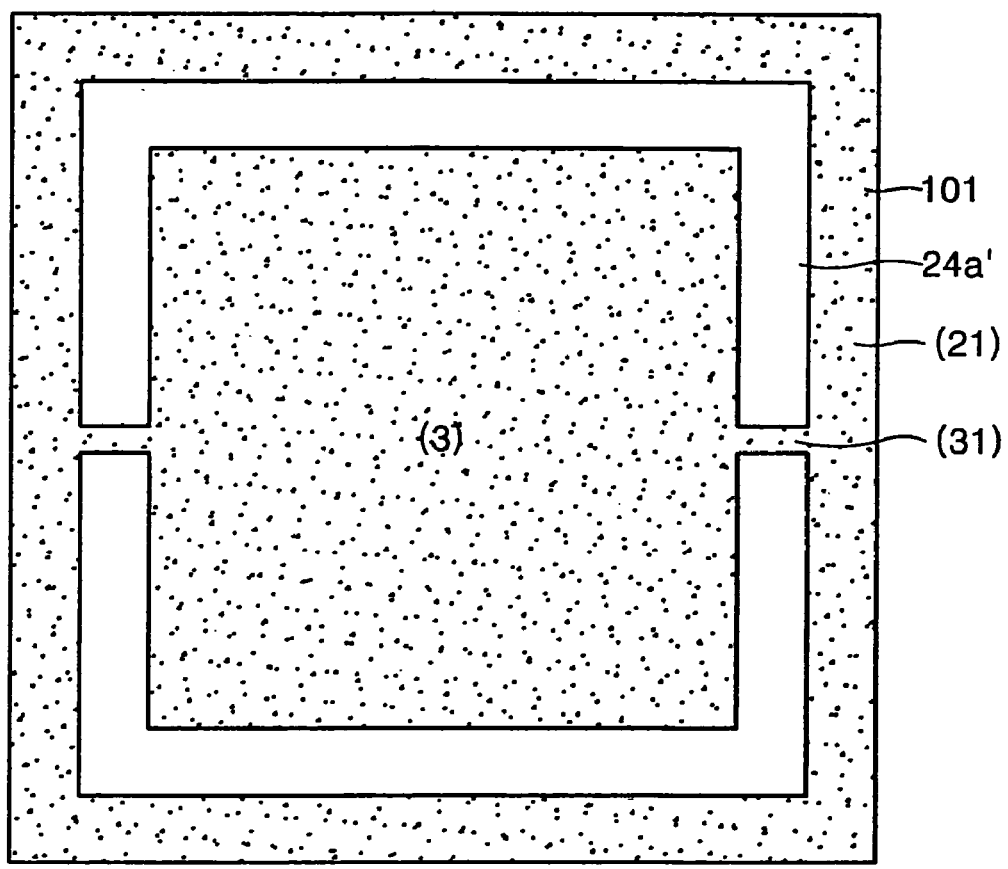
FIG. 5 is a top view of the plate at the step shown in FIG. 4a in the method of manufacturing a micro-actuator of the present invention.

The following processes explain how a plurality of top structures are formed from one wafer. In order to facilitate understanding, the explanation is for one top structure, and FIGS. 4a through 4b illustrate one top structure a) A shown in FIG. 4a, a first plate 100 that is made of a silicon (Si) wafer has a thickness corresponding to the sum of the height of the top comb-type electrode 32 and the thickness of the stage 3, for example, a thickness of 100 μm. An etching mask layer 101 is formed on the surface of the plate 100. The etching mask layer 101 is formed of photoresist. In the etching mask layer 101, a part, excluding the region corresponding to the torsion bar 31 and the state 3 and the first frame layer 21 of the frame 2, surrounding the torsion bar and the state, i.e., a separate region 24a' corresponding to the separate region 24a, is removed by the etching process of a photolithography method, as shown in FIG. 5. FIG. 5 is a top view of the plate 100 at the step shown in FIG. 4a and having a mask layer 101 formed on the top surface of the plate 100. The reference numerals 31, 3, and 21 in FIG. 5 respectively represent the areas corresponding to the torsion bar, stage and first frame layer of the frame surrounding the stage.

b) As shown in FIG. 4b, the separate region 24a is formed by etching to a predetermined depth the part of the first plate 100 that is exposed by the separate region 24a'. When etching, the depth (t1) corresponds to the thickness of the torsion bar 31 and the stage 3. The etching method is dry etching or wet etching.

c) As shown in FIG. 4c, the etching mask layer 101 is removed. Here, the etching mask layer 101 formed by the photoresist is removed by a wet etching solution, and is followed by a step of washing with deionized water.

d) As shown in FIG. 4d, a metal seed layer 23a is formed on the bottom of the first plate 100 by a deposition method. The metal seed layer is formed by depositing 500 ɔof Cr and depositing approximately 1500 ɔof Au on top of the Cr.

e) As shown in FIG. 4e, a plating mask layer 102 is formed on top of the seed layer 23a. The plating mask layer is formed on all parts except the part where the frame 2 is to be formed. The plating mask layer 102 is formed through a patterning process by coating the photoresist and photolithography.

f) As shown in FIG. 4f, a metal eutectic bonding layer 23b is formed by plating the exposed part of the seed layer that is not covered by the plating mask layer 102 with Au/Sn to a predetermined depth.

g) As shown in FIG. 4g, after the plating mask layer 102 is removed with an etching solution, the entire first plate 100 is washed with deionized water.

h) As shown in FIG. 4h, an etching mask layer 103 is formed on the seed layer 23a and the metal eutectic bonding layer 23b.

i) As shown in FIG. 4i, the etching mask layer 103 formed on the eutectic bonding layer 23b is kept, but the part formed on the seed layer 23a is removed. This patterning process may be accomplished by a general photolithography method. Here, the seed layer 23a, excluding the part of the frame 2, where the etching mask layer 103 is not kept, is removed with a chemical etching solution.

j) As shown in FIG. 4j, after the remaining etching mask layer 103 on the metal eutectic bonding layer 23b is removed, the entire plate 100 is washed.

k) As shown in FIG. 4k, an etching mask layer 104 for forming a predetermined pattern of driving comb-type electrodes on the bottom of the first plate 100 is formed. The etching mask layer 104 is formed inside the separate region 24a and on the metal eutectic bonding layer 23b. The patterning process can be accomplished by a general photolithography method.

l) As shown in FIG. 4l, the driving comb-type electrodes are formed using dry etching, for example, ICPRIE (Inductively Coupled Plasma Reactive Ion Etching). Here, the first plate is etched to a depth reaching the bottom of the separate region 24a, that is the value of subtracting the depth t1 of the separate region 24a from the total depth of the first plate 100. Therefore, the separate region 24a is etched through, and the stage 3 inside of the separate region 24a, the first frame layer 21 of the frame 2, and the torsion bar 31 (not shown in FIG. 4l) that crosses the separate region 24a are formed.

m) As shown in FIG. 4m, the driving comb-type electrodes 32 and the metal eutectic bonding layer 23b are allowed to be exposed by removing the etching mask layer 104.

In the manufacturing process of the top structure, the process is carried out with a reinforcement wafer around 500 μm thick attached to the first plate 100, and the adhesive, for example, photoresist, that are used to bond the first plate 100 and the reinforcement wafer together is removed in this step. In doing so, each unit of the top structure is separated from the first plate 100. Each unit of the top structure is washed and dried, thus completing the top structure manufacture.

Figure 6A:
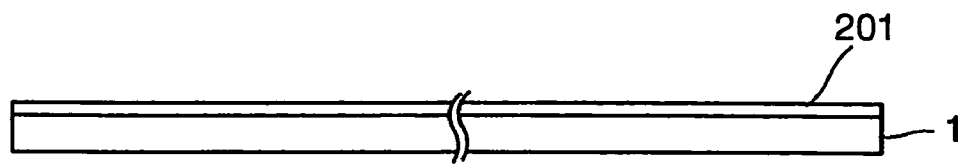
FIGS. 6a–6d are process diagrams illustrating the steps of manufacturing the base plate that supports the top and bottom structures of a micro-actuator of the present invention.
Figure 6B:
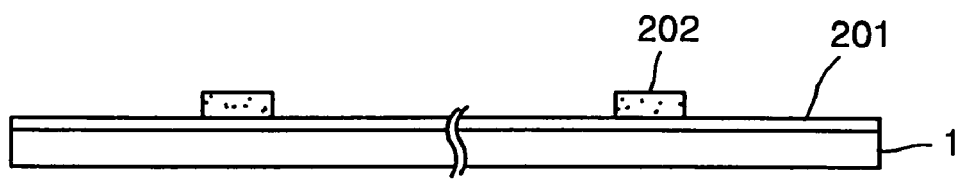
Figure 6C:
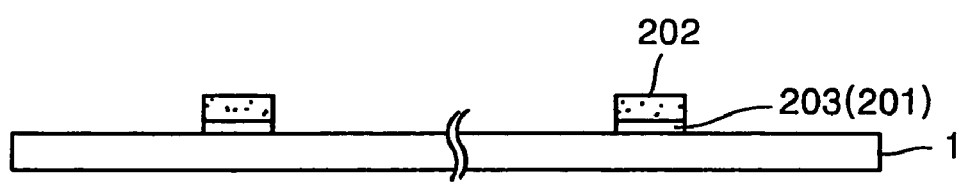
Figure 6D:
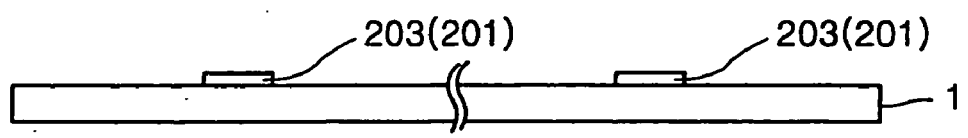

2. A Method of Manufacturing the Base Plate for Supporting the Top and Bottom Structures a) As shown in FIG. 6a, a metal layer 201 for forming signal lines is deposited on top of the base plate 1 made of PYREX® glass material, etc., with the thickness of 500 µm. The metal layer 201 is used in adhering to Au wires and is thus preferably formed with Au. Here, the plate 1 is the base plate 1 that supports the total micro-actuator shown in FIGS. 2 and 3.

b) As shown in FIG. 6b, an etching mask 202 is formed on the metal layer 201.

c) As shown in FIG. 6c, signal lines 203 are formed from the metal layer 201 by etching the exposed part of the metal layer.

d) As shown in FIG. 6d, the plate 1 is washed and dried after removing the etching mask 202 remaining on the signal lines 203.

The signal lines 203 shown in FIGS. 6a through 6d are illustrated schematically in order to facilitate understanding. In reality, there may be more signal lines produced than shown in the figures and they may be formed in a different pattern. The signal lines 203 shown in FIGS. 6a through 6d are connected to the first electrode base 35a and the second electrode base 35b and the frame (not shown). In FIGS. 1 through 3 the signal lines 203 are not shown.

3. A Method of Manufacturing the Bottom Structure

Figure 7A:
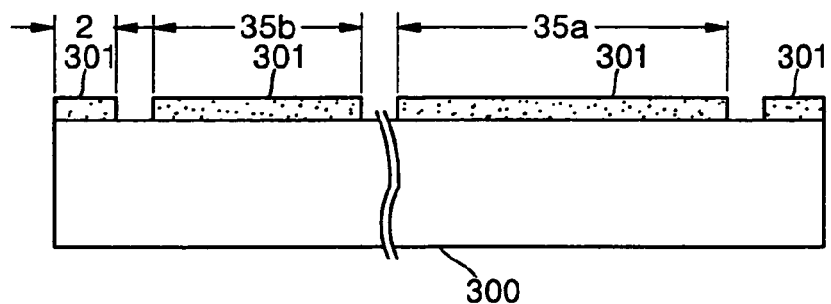
FIGS. 7a–7n are process diagrams illustrating the steps of manufacturing the bottom structure of a micro-actuator of the present invention.
Figure 7B:
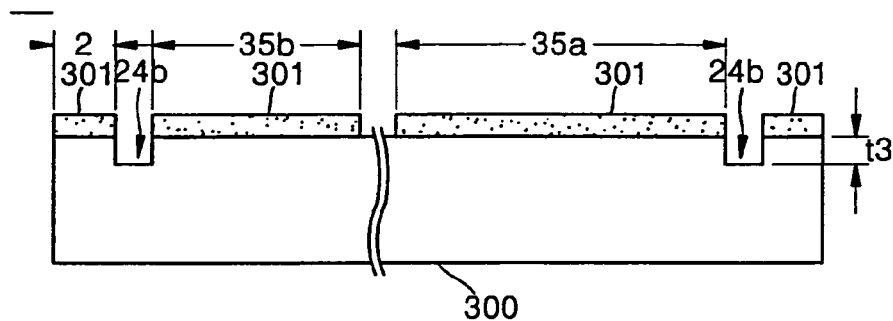
Figure 7C:
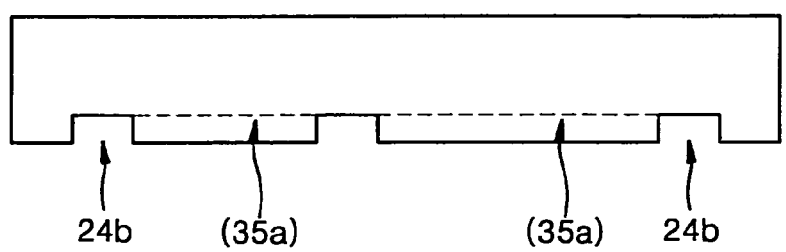

The following process explains how a plurality of bottom structures are formed from one wafer. In order to facilitate understanding, the explanation is for one bottom structure, and FIGS. 7a through 7n illustrate one bottom structure.

a) As shown in FIG. 7a, a predetermined pattern of an etching mask 301 is formed on top of a second plate 300 made of a silicon wafer. The second plate 300 has a thickness of about 100 µm. The etching mask 301 covers the region corresponding the second frame layer 22 of the frame 2, the first electrode base 35a, and the second electrode base 35b described above. The etching mask 301 is not formed on the part of the frame 2 corresponding to the signal lines 203 connected to the first and second electrode bases 35a and 35b among the signal lines 203 formed on the plate 1, and is thus etched to a predetermined depth in a later etching process. This is to electrically separate the signal lines 203 from the second frame layer 22 of the frame 2 electrically connected to the stage 3.

b) As shown in FIG. 7b, the part that is not covered by the etching mask 301 is etched to a predetermined depth into the second plate 300 by a dry etching method. Here, the etching depth is larger than the thickness of the signal lines 203, corresponds to the thickness of the first and second electrode bases 35a and 35b, and preferably has a value of 15 µm or so.

c) As shown in FIG. 7c, after the etching mask 301 is removed with an etching solution, the entire second plate 300 is washed with deionized water and then dried.

Figure 7D:
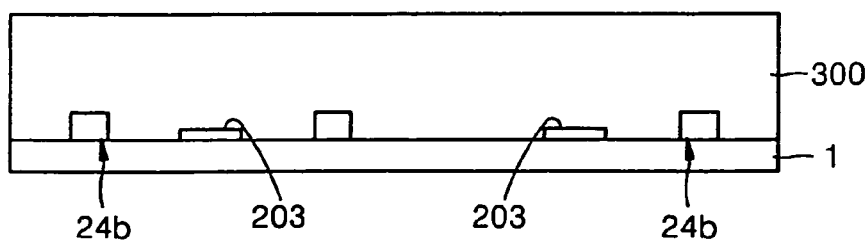
Figure 7E:
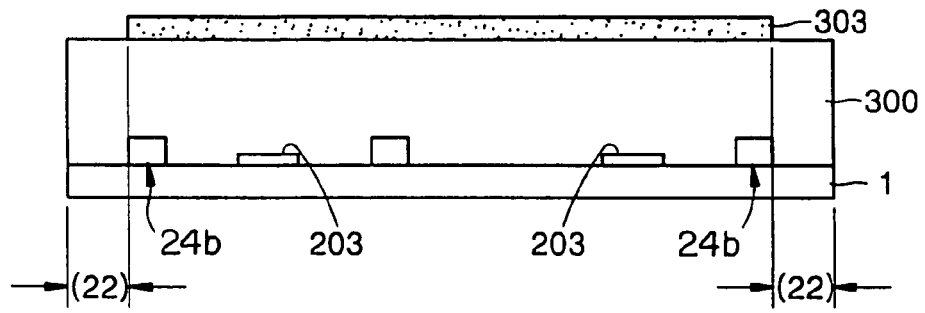
Figure 7F:
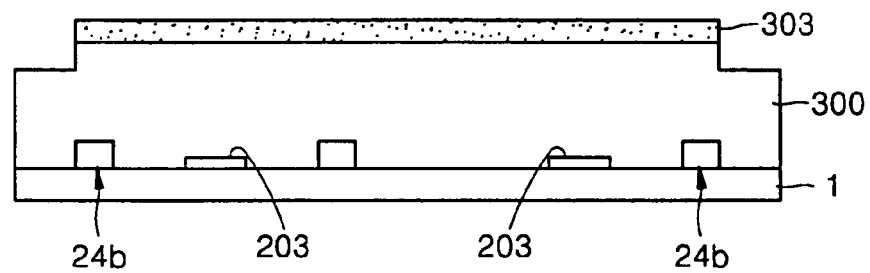
Figure 7G:
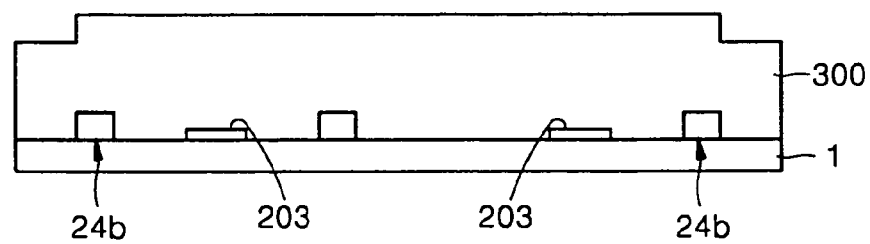
Figure 7H:
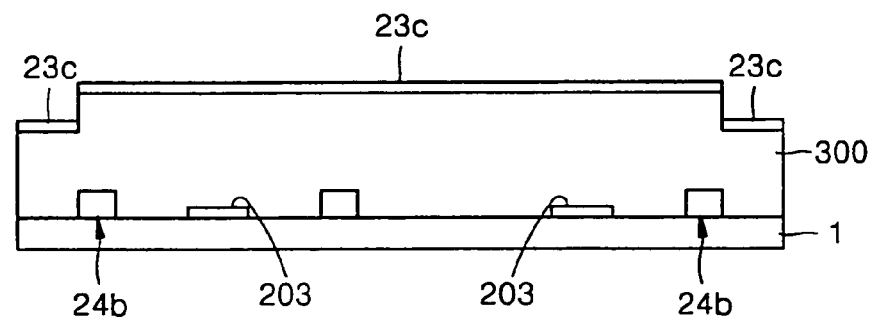
Figure 7I:
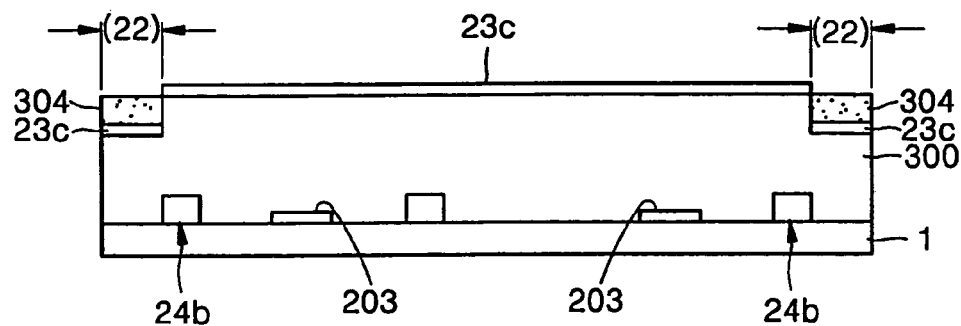
Figure 7J:
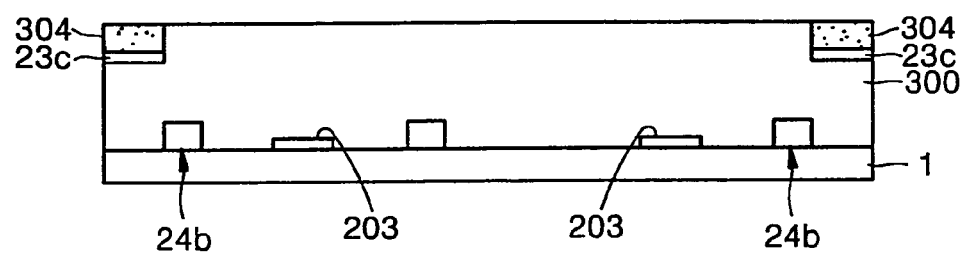
Figure 7K:
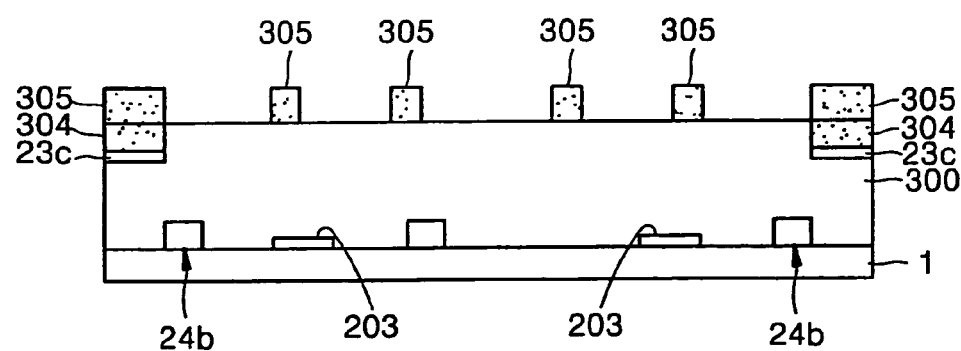
Figure 7L:
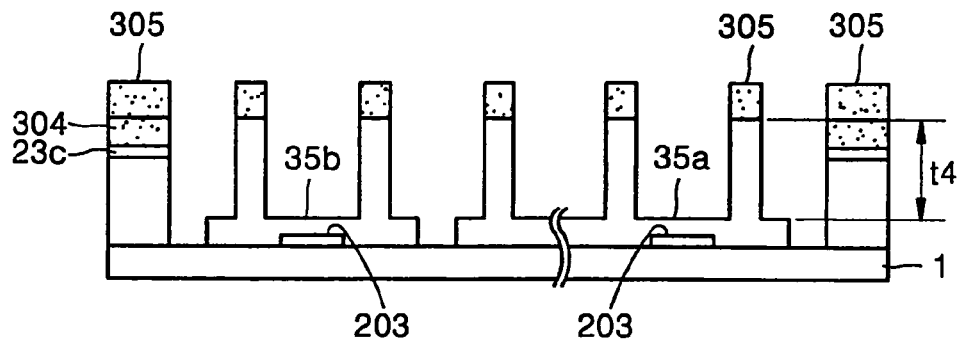
Figure 7M:
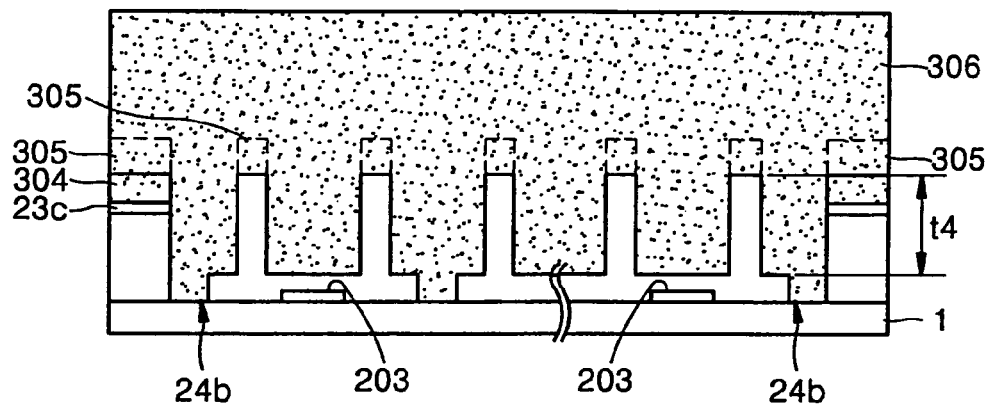
Figure 7N:
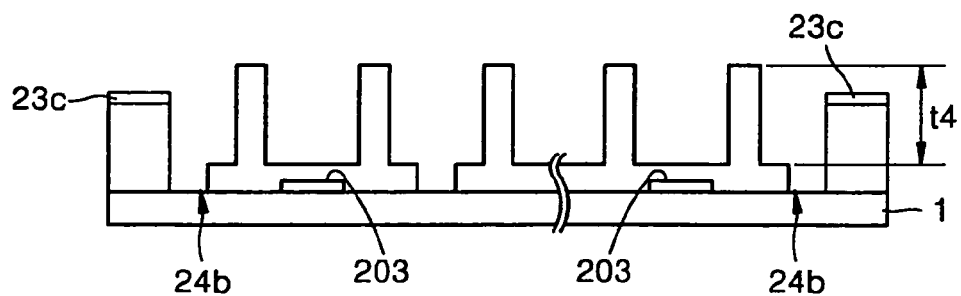

Therefore, the separate region 24b is formed inside the second frame layer 22 of the frame 2 that will be completed later, and the outlines of the first and second electrode bases 35a and 35b that are not completed, are shown as a dashed line.

a) As shown in FIG. 7d, the second plate 300 and the base plate 1 made of PYREX® glass material, etc., are bonded together with an anodic bonding process by applying heat, pressure and voltage.

e) As shown in FIG. 7e, an etching mask 303 is formed on top of the second plate 300 for forming the second frame layer. The etching mask 303 is formed on the region excluding the second frame layer 22 of the frame 2.

f) As shown in FIG. 7f, the part corresponding to the second frame layer 22 that is not covered by the etching mask 303 is etched to a predetermined depth. Here, when manufacturing a micro-actuator having an area of 1500 µm×1200 µm, the frame part is etched to a depth of 40 µm, and then, an align key (not shown) for joining the top structure is inserted. Here, the etching depth is a function of the overlapping area of the driving and fixed comb-type electrodes and the etching depth should be adjusted appropriately according to the design of the overlapping area.

g) As shown in FIG. 7g, the etching mask 303 is removed, and the second plate 300 is washed and dried.

h) As shown in FIG. 7h, a bottom metal layer 23c is deposited on the entire second plate 300. Here, the same metal as the material of the seed layer 23a mentioned earlier is preferably used.

i) As shown in FIG. 7i, an etching mask 304 is formed on the regions corresponding to the second frame layer 22 of the frame 2, and the surface of the bottom metal layer 23c that protrudes is maintained to allow exposure.

j) As shown in FIG. 7j, the bottom metal layer 23c that is not covered by the etching mask 304 is removed so that the surface of the second plate 300 can be exposed.

k) As shown in FIG. 7k, an etching mask 305 is formed on the parts corresponding to the fixed comb-type electrodes 34 and the second frame layer 22 of the frame 2.

l) As shown in FIG. 7l, the exposed part of the second plate 300 that is not covered by the etching mask 305 is etched to a predetermined depth (t4) using the ICPRIE method. The etching depth is determined by subtracting the depth t3 of the separate region 24b from the thickness of the second plate 300. The first and second electrode bases 35a and 35b and the second frame layer 22 of the frame 2 are formed on the plate 1 by etching in this manner.

m) As shown in FIG. 7m, a protective layer 306 of photoresist is formed on the entire plate 1. This is a preprocessing step for separating units of the bottom structure from the plate 1 and to prevent the bottom structure from being damaged and destroyed by dicing process for separating the units of the bottom structure. After forming the protective layer in this manner, the plate 1 and the units of the bottom structure positioned on top of the plate 1 are separated by using a dicing saw.

n) As shown in FIG. 7n, the protective layer 306 and the etching mask 305 are removed with a chemical etching solution, and the remaining parts are washed and dried. After washing and drying, the bottom structure of the plate 1 is completely formed.

4. A Method of Bonding the Top and Bottom Structures

This step completes the manufacture of the micro-actuator by bonding the units of the top and bottom structures formed in the above processes.

Figure 8A:
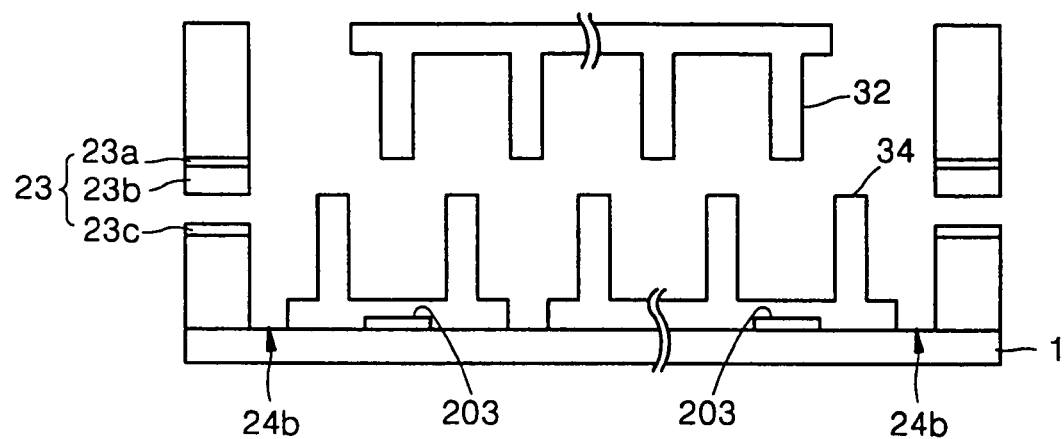
FIGS. 8a–8b are process diagrams illustrating the steps of joining the top and bottom structure into one body in the method of manufacturing a micro-actuator of the present invention.
Figure 8B:
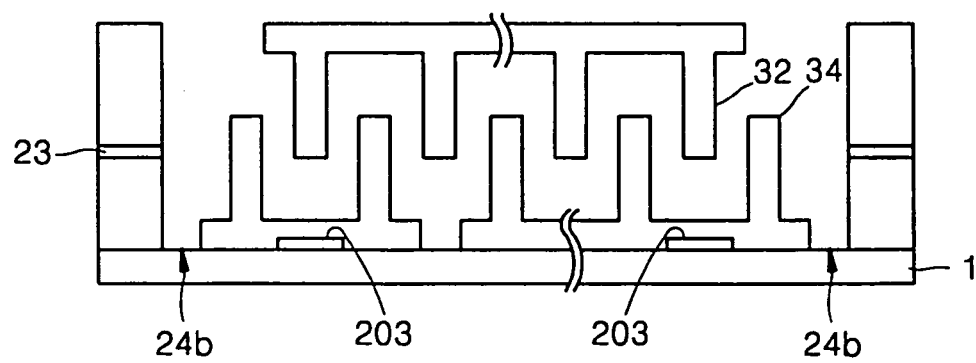

After aligning the top and bottom structures as shown in FIG. 8a, they are bonded together into one structure as shown in FIG. 8b. The alignment and bonding of the top and bottom structures are realized with the aid of vacuum chucks. The top and bottom structures are individually bonded with a flip chip bonder. After fixing the top and bottom structures separately in two vacuum chucks, the two structures are aligned with the help of a microscope. When the arrangement is completed, the two vacuum chucks are drawn closer together, and the top and bottom structures are bonded into one structure. If the pressure and the eutectic temperature are kept constant at this time, the metal eutectic bonding layer 23b melts and adheres to and the bottom metal layer 23c, thus the first frame layer 21 and second frame layer 22 of the frame 2 are joined into one structure. The metal layer 23 is shown as having a very thin thickness in FIG. 8b. The seed layer 23a, the metal eutectic bonding layer 23b and the bottom metal layer 23c, constituting the metal layer 23, are very thin and were shown exaggerated in the previous figures.

The micro-actuator was manufactured using the processes described above. Driving the stage in a see-saw motion at a predetermined frequency and a certain angle range confirmed the expected results.

Figure 9:
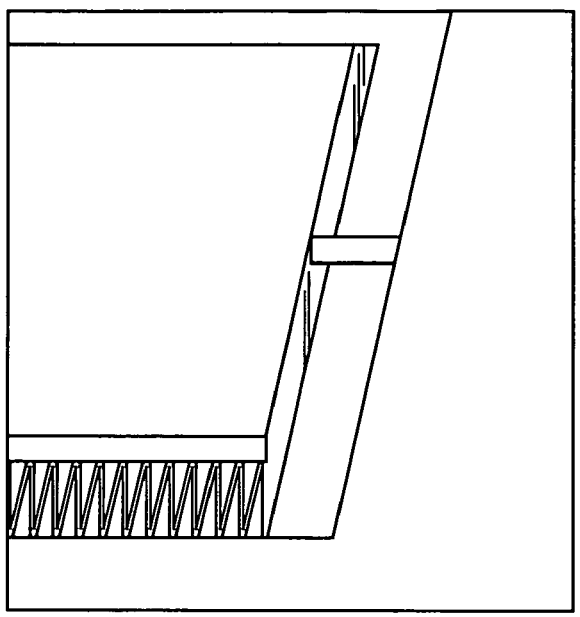
FIGS. 9 and 10 are Secondary Electron Microscopy (SEM) photographs of the top structure in the neighborhood of the torsion bar of a sample manufactured according to the method of manufacturing a micro-actuator of the present invention.
Figure 10:
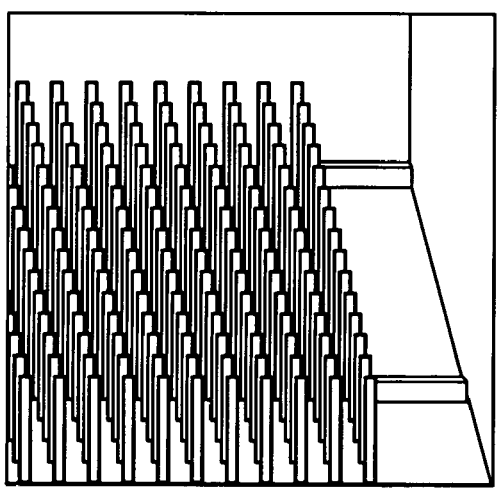
Figure 11:
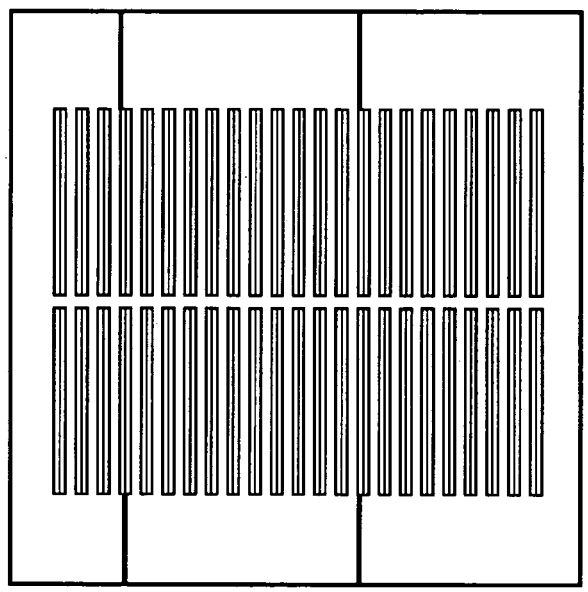
FIG. 11 is a SEM photograph illustrating the planar characteristic of the bottom structure of a sample manufactured according to the method of manufacturing a micro-actuator of the present invention.
Figure 12:
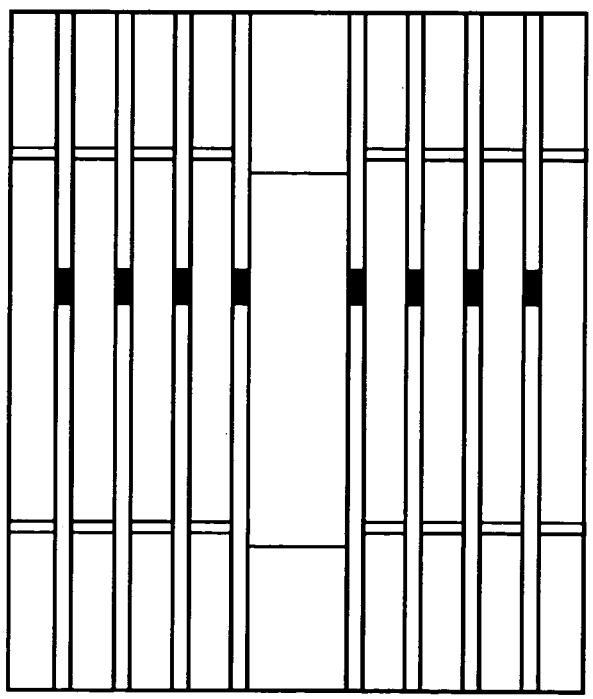
FIG. 12 is a magnified SEM photograph of the fixed comb-type electrodes formed at the bottom structure of a sample manufactured according to the method of manufacturing a micro-actuator of the present invention.
Figure 13:
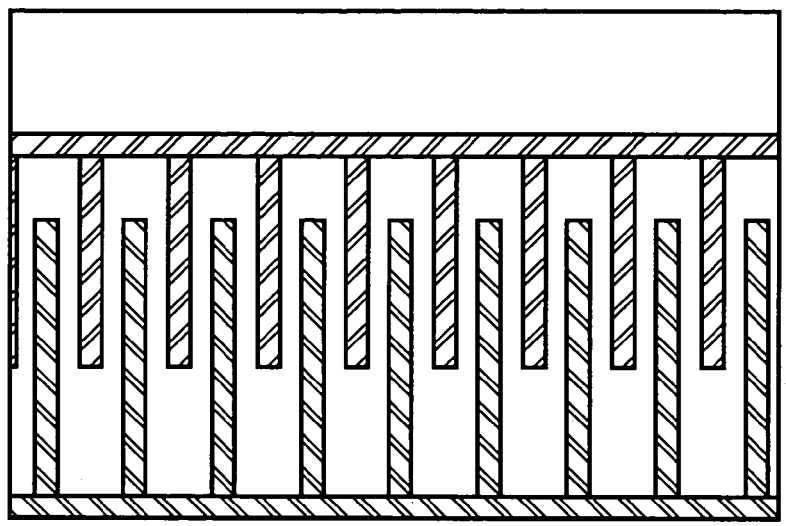
FIG. 13 is a magnified SEM photograph of the driving comb-type electrodes and the fixed comb-type electrodes after the top and bottom structures are joined in a sample manufactured according to the method of manufacturing a micro-actuator of the present invention.
Figure 14:
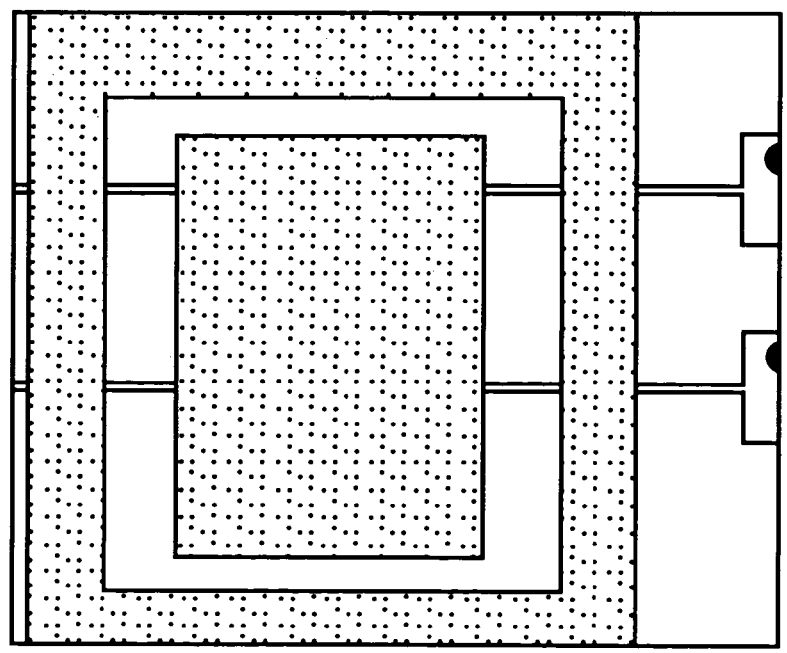
FIG. 14 is a photograph illustrating the planar characteristics of a micro-actuator manufactured by the manufacturing method of the present invention.

FIGS. 9 and 10 are SEM photographs illustrating the top structure in the neighborhood of the torsion bar 31 in a micro-actuator manufactured according to the present invention. FIG. 11 is a SEM photograph illustrating the planar characteristic of the bottom structure. FIG. 12 is a magnified SEM photograph of the fixed comb-type electrode formed in the bottom structure. FIG. 13 is a magnified SEM photograph of the driving and fixed comb-type electrodes in the joined top and bottom structures, and FIG. 14 is a photograph illustrating the planar characteristic of a micro-actuator manufactured according to the present invention.

The micro-actuator having the structure described above may be applied to various situations. If an optical mirror is formed on the surface of the stage, the micro-actuator may be used as an optical scanner that reflects incident light within a certain angular range. This optical scanner may be applied to the scanner of an optical head in an image display unit like televisions using laser and optical magnetic data storage units.

As explained above, according to the manufacturing method of the present invention, the micro-actuator with the aimed structure can be made successfully, and may be produced particularly with a high manufacturing yield. In particular, foreign materials between comb-type electrodes that can be generated in the manufacturing process, can be effectively prevented, and thus the top and bottom structures can be bonded quickly and reliably.

The present invention is explained with reference to an embodiment shown in the attached figures, but this is only an example, and anyone skilled in the art can understand that various modifications to the described embodiment may be made without departing from the spirit and scope of the present invention as defined by the appended claims.

What is claimed is:

1. A method for manufacturing a micro-actuator comprising the steps of:
    forming a top structure by processing a first plate, the top structure comprising a substantially rectangular stage, a plurality of driving comb-type electrodes formed on the bottom of the stage, a first frame layer separated from and surrounding the stage along the periphery the stage and having a first height, and at least one torsion bar for suspending the stage from the first frame layer and providing a restoring force upon rotation of the stage along an axial direction of the torsion bar;
    forming a bottom structure by processing a second plate and a base plate, the bottom structure comprising a base plate, a plurality of fixed comb-type electrodes formed on the base plate, and a second frame layer formed on the base plate and surrounding the fixed comb-type electrodes and having a second height; and
    joining the top and bottom structures to form one body by forming a eutectic bonding layer between the first frame layer and the second frame layer, said first frame layer being aligned with the second frame layer so that the driving comb-type electrodes interdigitate the fixed comb-type electrodes.
    wherein an electrostatic force induced between the driving comb-type electrodes and the fixed comb-type electrodes causes the stage to rotate alone the axial direction during operation of the micro-actuator.

2. The method for manufacturing a micro-actuator of claim 1, wherein the bottom side of the second plate is joined to the top surface of the base plate by an anodic bonding process.

3. The method for manufacturing a micro-actuator of claim 1, wherein an optical mirror is formed on the top surface of the stage.

4. The method for manufacturing a micro-actuator of claim 1, further including a plurality of sensor comb-type electrodes on the base plate, said sensor comb-type electrodes interdigitating a portion of the driving comb-type electrodes and being operative to generate a signal commensurate with a relative position of the fixed comb-type electrodes to the driving comb-type electrodes.

5. The method for manufacturing a micro-actuator of claim 1, wherein the step of forming a bottom structure comprise the steps of:
    forming signal lines on the top surface of the base plate with a predetermined pattern corresponding to constituent elements;
    forming a bottom separate region on the bottom side of the second plate, said bottom separate region having an etched pattern that corresponds to a space between the second frame layer and the fixed comb-type electrodes;
    joining the bottom side of the second plate to the top surface of the base plate;
    etching a region corresponding to the second frame layer to a predetermined depth on the top side of the second plate;
    forming a bottom metal layer on the etched region of the second plate;
    forming a mask layer on a portion corresponding to the second frame layer and the fixed comb-type electrodes over the top side of the second plate;
    etching the second plate with the mask layer to form the fixed comb-type electrodes and the second frame layer; and
    removing the mask layer.

6. The method for manufacturing a micro-actuator of claim 5, wherein the step of joining the top and bottom structures into one body comprises a step of performing the metal eutectic bonding at a predetermined temperature and pressure in order to join the top metal layer of the first frame layer of the top structure to the bottom metal layer of the second frame layer of the bottom structure.

7. The method for manufacturing a micro-actuator of claim 6, wherein the bottom side of the second plate is joined to the top surface of the base plate by an anodic bonding process.

8. The method for manufacturing a micro-actuator of claim 1, wherein the step of forming a top structure comprises the steps of;
    forming a top separate region on one side of the first plate, said top separate region having an etched pattern that corresponds to a space between the stage and the first frame layer;
    forming a top metal layer on a region over the other side of the first plate, said region corresponding to the first frame layer;

forming an mask layer on the other side of the first plate, said mask layer being patterned to form the stage, driving comb-type electrodes, torsion bar and the first frame layer upon etching the first plate;

etching the first plate with the mask layer to form the top structure; and removing the mask layer.

9. The method for manufacturing a micro-actuator of claim 8, wherein the step of forming the bottom structure comprise the steps of:

forming signal lines on the top surface of the base plate with a predetermined pattern corresponding to constituent elements;

forming a bottom separate region on the bottom side of the second plate, said bottom separate region having an etched pattern that corresponds to a space between the second frame layer and the fixed comb type electrodes;

joining the bottom side of the second plate to the top surface of the base plate;

etching a part corresponding to the second frame layer to a predetermined depth on the top side of the second plate;

forming a bottom metal layer on the etched part of the second plate;

forming an etching mask layer on a portion corresponding to the second frame layer and the fixed comb-type electrodes over the top side of the second plate;

etching the second plate with the etching mask layer to form the fixed comb-type type electrodes and the second frame layer; and removing the etching mask layer.

10. The method for manufacturing a micro-actuator of claim 8, wherein the step of forming a top metal layer comprises the steps of:

forming a metal seed layer on the other side of the first plate; and forming a metal eutectic bonding layer by a plating method on the seed layer.

11. The method for manufacturing a micro-actuator of claim 10, wherein the step of joining the top and bottom structures into one body comprises a step of performing the metal eutectic bonding at a predetermined temperature and pressure in order to join the top metal layer of the first frame layer of the top structure to the bottom metal layer of the second frame layer of the bottom structure.

* * * * *